US006432788B1

(12) United States Patent
Maruska et al.

(10) Patent No.: US 6,432,788 B1
(45) Date of Patent: Aug. 13, 2002

(54) METHOD FOR FABRICATING AN EMITTER-BASE JUNCTION FOR A GALLIUM NITRIDE BIPOLAR TRANSISTOR

(75) Inventors: H. Paul Maruska, Winter Springs, FL (US); Stephen N. Bunker, Wakefield, MA (US)

(73) Assignee: Implant Sciences Corporation, Wakefield, MA (US)

( * ) Notice: Subject to any disclaimer, the term of this patent is extended or adjusted under 35 U.S.C. 154(b) by 8 days.

(21) Appl. No.: 09/624,375

(22) Filed: Jul. 24, 2000

Related U.S. Application Data
(60) Provisional application No. 60/145,187, filed on Jul. 22, 1999.

(51) Int. Cl.[7] ............................................. H01L 21/8222
(52) U.S. Cl. ........................ 438/328; 438/141; 438/520
(58) Field of Search ................................. 438/518, 520, 438/522, 523, 602, 604, 141, 312, 328

(56) References Cited

U.S. PATENT DOCUMENTS 5,880,485 A * 3/1999 Marx et al. ................... 257/94
6,139,629 A * 10/2000 Kisielowski et al. ....... 111/105
2001/0048113 A1 * 12/2001 Kim ............................. 257/98

* cited by examiner

Primary Examiner—Tuan H. Nguyen
(74) Attorney, Agent, or Firm—Foley Hoag LLP (57) ABSTRACT

The present invention comprises methods for producing semiconductor devices useful in high temperature applications. The invention is based on using silicon ion implantation to convert a portion of the p-type base layer of magnesium-doped GaN into n-type GaN. The boundary of the n-type GaN within the p-type layer then becomes an n-p diode junction which can function as the emitter-base junction. The present methods utilize ion implantation to convert a portion of the p-type layer to n-type thereby forming an n-p junction having desirable diode characteristics. The invention also includes BJT and HBT devices incorporating the present implanted n-p diode junctions.

12 Claims, 5 Drawing Sheets

METHOD FOR FABRICATING AN EMITTER-BASE JUNCTION FOR A GALLIUM NITRIDE BIPOLAR TRANSISTOR

RELATED U.S. APPLICATION(S)

The present application claims priority to U.S. Provisional Application Serial No. 60/145,187, filed Jul. 22, 1999, which is hereby incorporated herein by reference.

TECHNICAL FIELD

This invention relates to the field of gallium nitride semiconductor devices used for high power or high temperature applications, and more specifically to a method for fabricating an n-p diode structure useful in the manufacture of a gallium nitride bipolar junction transistor.

BACKGROUND OF THE INVENTION

Gallium nitride (GaN) and related binary and ternary nitride semiconductors exhibit unique properties which can be expected to provide new high power electronic devices which can operate effectively in high temperature environments. The III–V nitride semiconductors offer an attractive alternative to traditional silicon and gallium arsenide (GaAs) based electronic devices, because they exhibit significantly improved materials properties based on stronger electronic bonding and wider band gaps. Materials growth technology for GaN has advanced in recent years to produce excellent quality material for device fabrication. A particular parameter of interest for electronic applications is the large band gap of GaN (3.4 eV), which makes it an excellent candidate as an amplifier or switch which can continue to operate at temperatures approaching 600° C. Field-effect transistor (FET) devices based on GaN have been successfully tested up to 500° C. (S.C. Binari et al, Solid-State Electronics, vol. 41, p. 177, February 1997)

Bipolar junction transistors (BJT) are well known to have advantages over field-effect transistors for certain applications. When dealing with high power applications, the large current must pass through a commensurately large cross-sectional area. For an FET, the channel is always thin (<1 micron), so the width of the device must then be very large in order to carry the current. With a BJT, the current flows in a vertical direction, and therefore the cross sectional area can be a square, and this requires less surface area on the wafer, yielding more devices per wafer. BJTs are much more linear in operation, and therefore they are well suited to analog applications. Finally, the switching speed of a BJT is determined by the thickness of the buried base, and thus photolithography precision is not an issue. However, for an FET the speed is determined by the length of the gate, and this dimension depends on the resolution of the photolithography. Because GaN can withstand high operating temperatures, these BJT transistors can be used in environments where it is difficult to provide cooling, such as on board spacecraft, in jet engines, in nuclear power plants, and at the bottom of oil wells.

Although many reports of nitride based FETs have been made, it has proven to be very challenging to make a GaN BJT. This is the result of the difficulty in preparing conducting p-type GaN. The most useful p-type dopant for GaN is magnesium (Mg). However, when GaN is grown by metal-organic chemical vapor deposition (MOCVD), there is always hydrogen present in the growth environment, and hydrogen atoms become incorporated in the crystal lattice along with each Mg atom. The hydrogen then passivates each Mg atom, and magnesium plus hydrogen fails to impart p-type conductivity to GaN. To overcome this problem, it has been necessary to anneal the sample at an elevated temperature after growth to remove the hydrogen. This has become standard practice. (S. Nakamura et al, *Jpn. J. Appl. Phys.*, vol. 31, p. 1252, May, 1992)

However, to form a bipolar junction transistor using only MOCVD growth techniques, a layer of n-type GaN must be grown on top of the Mg-doped base to form the emitter, which becomes the third layer of the transistor. N-type GaN is impervious to the diffusion of hydrogen. Thus once the emitter layer is deposited, the base is enclosed, hydrogen is not removable, and the magnesium cannot be activated. Only if almost all of the emitter layer is removed, leaving only a tiny mesa, can the hydrogen escape from the base (See for example Lee S. McCarthy, P. Kozodoy, M. Rodwell, S. DenBaars, U. K. Mishra, WGIC Conf., Nara, Japan, Oct. 12, 1998). The drawbacks of this method are twofold. The removal of the bulk of the emitter layer is accomplished using reactive ion etching. This procedure leaves only a very small cross sectional area emitter and hence low power handling ability. This is contrary to the requirements of a BJT, which must deal with high power. In addition, the etching turns the exposed surface of the base from p-type to n-type, requiring further wet chemical etching and subsequent regrowth of new p-type material.

SUMMARY OF THE INVENTION

The present invention comprises methods for producing semiconductor devices useful in high temperature applications. The invention is based on using silicon ion implantation to convert a portion of the p-type base layer of magnesium-doped GaN into n-type GaN. The boundary of the n-type GaN within the p-type layer then becomes an np diode junction which can function as the emitter-base junction. The present methods utilize ion implantation to convert a portion of the p-type layer to n-type thereby forming an n-p junction having desirable diode characteristics.

The present method for forming an n-p diode junction comprises the following general steps:

a. providing a single crystal substrate capable of permitting growth thereon of GaN;

b. disposing a layer of p-type GaN upon the substrate;

c. annealing the p-type layer formed in (b) to remove hydrogen;

d. defining island regions in the p-type material;

e. ion implanting silicon into the island regions of the p-type material;

f. depositing an AlN capping layer onto the ion-implanted regions;

g. annealing and electrically activating the ion implanted regions thereby converting these regions to n-type; and h. depositing metal contacts onto the n-type and p-type regions.

The present method can be applied for fabricating bipolar junction transistors utilizing the present n-p diode junctions. BJT's typically are multilayer devices. For power applications it is important to have large areas for the junctions and a very thin middle layer for the base. Silicon ion implantation into the base (p-type material) is compatible with the need for large area. The thin base layer is controlled by simply adjusting the energy of the ions, and thus their penetration distance, such that the resulting junction depth is slightly less than the thickness of the p-type layer. Ion implantation therefore allows the fabrication of a BJT with significantly fewer process steps compared to using MOCVD growth, mesa etching, and subsequent regrowth to form the device.

A BJT according to the present invention may be fabricated according to the following general procedure:

a. providing a substrate of single crystal material capable of permitting growth thereon of gallium nitride;

b. disposing at least two layers of n-type gallium nitride upon said substrate thereby forming an n-type doped subcollector layer and an n-type doped collector layer;

c. disposing a layer of p-type gallium nitride upon said layers of n-type gallium nitride;

a. annealing said p-type layer under conditions sufficient to remove hydrogen and to form a conducting base layer;

e. defining an isolated p-type mesa thereby exposing a surface of the collector layer;

f. defining a region of said p-type mesa and said exposed n-type collector layer of gallium nitride;

g. ion implanting silicon into said region of p-type mesa thereby forming an emitter, and into exposed surface of said n-type collector layer of gallium nitride thereby providing contact with the subcollector;

h. depositing an AlN capping layer onto said silicon ion implanted regions;

i. annealing and electrically activating said silicon ion implanted regions thereby providing n-type conductivity; and j. depositing metal contacts on the said p-type base and the said n-type emitter and collector.

In another aspect, the present invention comprises fabricating a heterojunction bipolar transistor (HBT) utilizing an n-p junction ion-implanted with silicon, aluminum and nitrogen. A process for fabricating an HBT according to the present invention comprises the following general steps:

a. providing a substrate of electrically conducting single crystal material capable of permitting growth thereon of gallium nitride;

b. disposing at least two layers of n-type gallium nitride upon said substrate thereby forming a doped subcollector layer and a doped collector layer;

c. disposing a layer of p-type gallium nitride upon said layers of n-type gallium nitride;

d. annealing said p-type layer under conditions sufficient to remove hydrogen and to form a conducting base layer;

e. defining island regions in said p-type material;

f. implanting silicon ions into said island regions of the p-type material;

g. implanting aluminum ions into said islands of the p-type material;

h. implanting nitrogen ions into said islands of the p-type material;

i. depositing an AlN capping layer onto the said silicon ion implanted surface;

j. annealing and electrically activating the silicon, aluminum, and nitrogen ion implanted regions under conditions sufficient to induce n-type conductivity and an enhanced band gap;

k. depositing metal contacts on said p-type and n-type regions; and l. depositing metal contacts onto the underside of said conducting substrate.

The present invention includes n-p diode junctions and transistors fabricated according to the procedures defined herein.

The present methods and devices have several advantages. A first advantage is that the entire surface of the p-type layer is initially exposed and thus the hydrogen contained in the p-type layer an be readily eliminated by conventional annealing techniques, ensuring the activation of the p-type base layer. A second advantage is the simplicity of the procedure.

Ion implantation is a well-known semiconductor process technology for materials such as silicon substrates, and it has often been used to dope the material to produce a p-n junction. However, successful electrical activation of ion implanted dopants in GaN by annealing has been elusive. An essential part of the present diode-formation method is the annealing of the crystal structure damage caused by the ion implantation process. When high energy silicon ions impinge on the surface of single crystal GaN, many of the atoms of gallium or nitrogen are displaced from their natural crystal lattice locations, resulting in either an amorphous or polycrystalline layer. Thermal annealing is normally used to regrow the single crystalline film. However, until recently the annealing has not been successfull, because GaN tends to partially decompose into gallium and nitrogen at a lower temperature than would be desirable for complete annealing of the crystal. This decomposition can be reasonably controlled by adding a "capping" layer of a nitride compound, for example, aluminum nitride (AlN), over the surface of the GaN prior to annealing. This cap helps to contain the nitrogen from escaping. AlN is preferred because of its inertness and compatibility with GaN. It is preferable to cap with substantially pure AlN.

DETAILED DESCRIPTION OF THE PREFERRED EMBODIMENTS

The substrate used in making the diodes of the present invention can be any single crystal substrate on which a GaN layer is or can be disposed. Preferred substrates include sapphire and sapphire having a GaN layer disposed thereon. Silicon carbide, silicon or spinel also may be used as substrates. "Spinel" refers to a group of materials having the general formula $AB_2O_4$ wherein A is magnesium, ferrous iron, zinc, manganese or a combination thereof, and B is aluminum, ferric iron, chromium or a combination thereof. The substrate typically is in the form of a wafer on which a plurality of diodes are fabricated simultaneously.

The process for disposing a layer of p-type GaN on the substrate can be performed by any conventional method effective for applying GaN layers, including MBE (molecular beam epitaxy) and MOCVD (metal organic chemical vapor deposition). In a preferred embodiment, the layer of p-type GaN is grown by MOCVD using magnesium (Mg) doping. Other p-type dopants which may be used include beryllium (Be), calcium (Ca), carbon (C) and zinc (Zn). The p-type dopant concentration preferably is between about $1\times10^{19}$ cm$^{-3}$ and about $5\times10^{19}$ cm$^{-3}$. Optionally, multiple layers of GaN may be disposed on the substrate as long as the topmost layer is p-type. Ions which are useful as n-type dopants include silicon (Si), germanium (Ge), sulfur (S) and oxygen (O), for example. The n-type dopant concentration preferrably is between about $1\times10^{16}$ and $1\times10^{18}$ cm$^{-3}$ for lightly doped layers and between about $1\times10^{19}$ and about $5\times10^{19}$ cm$^{-3}$ for heavily doped layers.

The annealing step is carried out under conditions sufficient to effect removal of hydrogen from the p-type layer. For this purpose, annealing the wafer in flowing inert gas (e.g., nitrogen or argon) at a temperature of about 700° C. for about 30 minutes is effective to remove hydrogen.

Figure 1A:
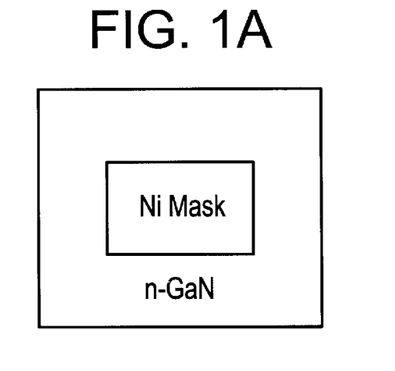
FIG. 1A is a schematic plan view of a diode of the present invention showing a nickel mask used to isolate the p-type mesa.
Figure 1B:
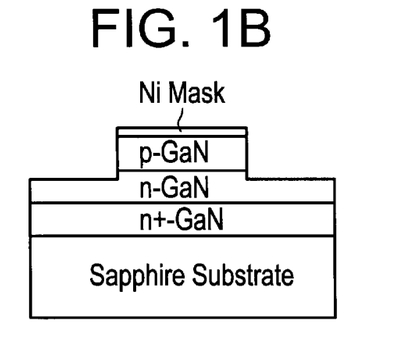
FIG. 1B is a schematic side view of the diode of FIG. 1A showing the sapphire substrate, two n-type GaN layers and the isolated p-type mesa.

Discrete regions or "island" regions then are defined in the p-type layer, using known masking techniques. For example, a nickel (Ni) mask can be disposed on portions of the p-type layer to define islands (see FIGS. 1A and B). Silicon dioxide ($SiO_2$) also can be used for this purpose. In some embodiments, an etching step may be performed after the protective mask is disposed on the p-type layer to remove the unmasked portions of the p-type layer, thereby forming a raised portion or "mesa" of p-type material (see FIG. 1B).

Figure 2A:
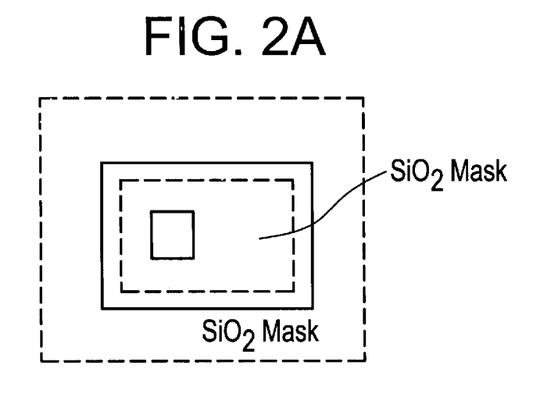
FIG. 2A is a schematic plan view of a diode of the present invention showing an $SiO_2$ mask covering all but the portion of the p-type layer to be ion implanted.
Figure 2B:
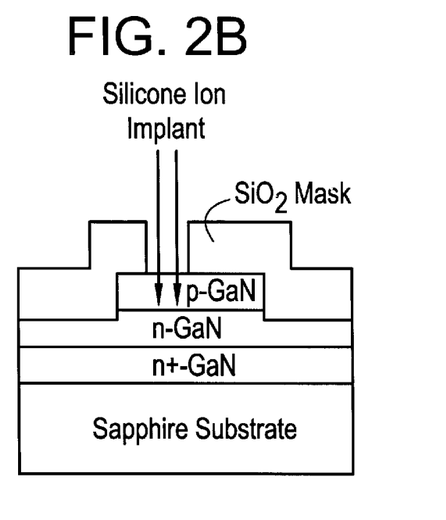
FIG. 2B is a schematic side view of the diode of FIG. 2A showing the direction of ion implantation of silicon ions.

The resulting island regions then are subjected to ion implantation of silicon atoms using known ion-implantation techniques. As stated above, a mask may be applied to a portion of the p-type and the n-type layers prior to ion implantation to define a region or regions of the p-type layer to be ion-implanted, as shown in FIGS. 2A and 2B. The mask may be formed from any suitable material, for example, Ni or $SiO_2$. The concentration of silicon atoms implanted during the implantation step (e) preferrably exceeds the concentration of Mg ions in the p-type layer. In a currently preferred embodiment, the Si concentration is at least about $1\times10^{19}$ cm$^{-3}$.

A capping layer then is applied to the ion-implanted regions. The capping layer preferably comprises AlN, however other nitride compounds also may be used. The AlN layer can be applied by any acceptable method for applying nitride coatings, including, for example, sputtering, chemical vapor deposition MBE or MOCVD. However, in a currently preferred embodiment, the best quality capping layer is produced using MOCVD techniques. Pure AlN can be chemically etched following the annealing step using a strong alkaline solution such as a potassium hydroxide (KOH) solution. Impure AlN often contains oxygen and other contaminants which do not readily dissolve, requiring a more complex ion etching removal technique.

The implanted regions then are electrically activated under conditions sufficient to convert the implanted regions from p-type to n-type. The activation step may be carried out by annealing the wafer at a high temperature in an inert atmosphere (e.g., nitrogen or argon gas). In a currently preferred embodiment, this step is carried out at a temperature of between about 1100° C. and about 1200° C. for about 10 to about 30 minutes, preferably for about 20 minutes.

Electrical contacts then may be applied to the diode. The p-type contacts preferably are nickel and gold, and the n-type contacts preferably are titanium and aluminum, although other conductive materials can be used.

A currently preferred method for fabricating an n-p diode junction using silicon ion implantation is described as follows. Using a conventional single crystal sapphire wafer substrate, GaN is grown by MOCVD using established techniques for the fabrication of n and p layers for light emitting diodes. Optionally, multiple layers of GaN may be grown with different doping types and levels as long as the topmost (i.e., the layer farthest removed from the substrate) layer is sufficiently doped as p-type. Formation of the ion implanted n-p diode junction follows the last step of this layer growth process. For example, first a low-temperature buffer layer of GaN is grown, then a highly n-type doped subcollector layer (e.g., having dopant concentration of from about $1\times10^{19}$ cm$^{-3}$ to about $5\times10^{19}$ cm$^{-3}$), a lightly n-type doped collector layer (e.g., having a dopant concentration of from about $1\times10^{16}$ cm$^{-3}$ to about $1\times10^{18}$ cm$^{-3}$) Finally, a p-type base is grown. The layers preferably are grown using MOCVD. Together, these comprise the normal collector-base diode structure conventionally grown. Because the efficiency of hole formation due to Mg doping is low (about 1%), the atomic Mg concentration should exceed about $1\times10^{19}$ atoms/cm$^{-3}$. The sample then is annealed in flowing nitrogen at about 700° C. for about 30 minutes. This activates the Mg and produces a concentration of mobile holes.

Another embodiment of the present method for fabricating examples of the present ion implanted diode junction is described as follows. The surface of the wafer is covered with $SiO_2$, using standard deposition techniques. Using photolithography, openings or islands are etched in the $SiO_2$ where each opening defines the n-type region of each diode which resides on the wafer, as shown in FIGS. 2A and 2B. Silicon is then ion implanted into the sample. The $SiO_2$ layer prevents ion implantation of silicon into any area except the exposed island. The $SiO_2$ layer then is removed by etching, e.g., in hydrofluoric acid. Next, a thin film of AlN is deposited on the surface by MOCVD. This film preferably is about 100 nm thick. The sample then is heated to a temperature of from about 1100° C. to about 1175° C. for about 20 minutes. This serves to remove the crystal damage which resulted from the ion implantation. Then the AlN film is etched away in about 5 minutes by inserting the sample in an alkaline solution (e.g., KOH) having a concentration of about 0.1 to about 1M at a temperature of about 65° C.

Figure 3A:
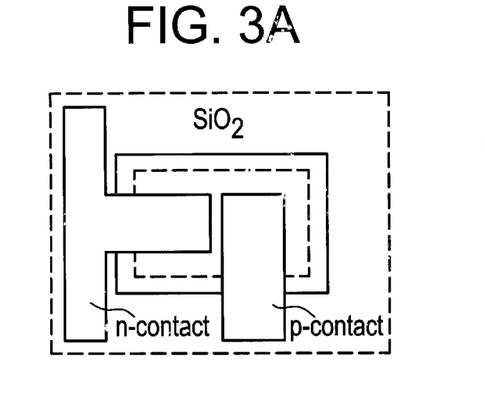
FIG. 3A is a schematic plan view of a preferred embodiment of a diode structure of the present invention with metal contacts.
Figure 3B:
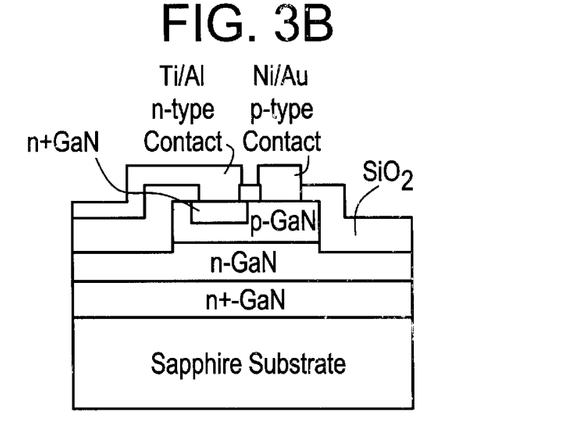
FIG. 3B is a schematic side view of the diode of FIG. 3A.

The wafer then is overcoated with another film of $SiO_2$. Using standard photolithographic procedures, holes are opened in the $SiO_2$, and metal contacts are applied to the n-type ion implanted island. A shadow mask can be used to define regions of photoresist, and all excess metal can be removed by lift-off. The contacts can be made by first evaporating titanium, followed by aluminum. The titanium film preferably is from about 100 to about 200 nm thick, while the aluminum preferably is several microns thick. ext, the adjacent contact to the remaining p-type material is patterned using standard photolithography. The contact metals for the p-type layer preferably are nickel (about 200 nm) followed by gold (several microns). The diodes are then annealed rapidly for about 2 minutes at about 600° C. to activate the metal contacts and make them ohmic. The complete emitter-base junction diode is shown schematically in FIGS. 3A. and B.

A preferred method for fabricating a bipolar junction transistor by ion implantation is substantially similar to the first embodiment for fabricating a p-n junction by ion implantation, except that while one or more n-type layers of GaN were optional in the first embodiment, the two n-type layers (the subcollector and collector) are required for the BJT. The same layers as described above for the emitter-base diode are grown, and a portion of the p-type layer (the base) is converted into an n-type region (the emitter). The major difference is in the lithography masks and the need to also implant silicon ions into the exposed n-type collector, which had been grown by MOCVD prior to the deposition of the p-type layer. The purpose of the silicon ion implantation into the n-type collector is to provide a conductive path through the high resistivity collector down to the collector for applying a contact. Silicon ion implantation is performed simultaneously with that into the island within the p-type layer.

Figure 4A:
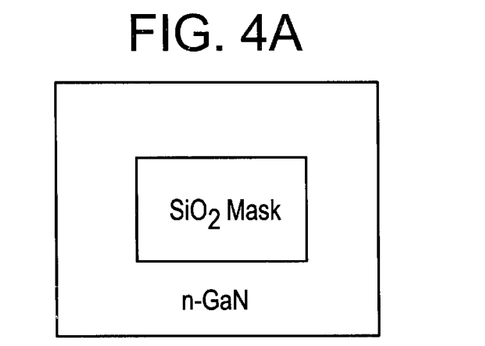
FIG. 4A is a schematic plan view of a diode of the present invention for use in a BJT having a silicon mask protecting the p-type mesa prior to silicon ion implantation.
Figure 4B:
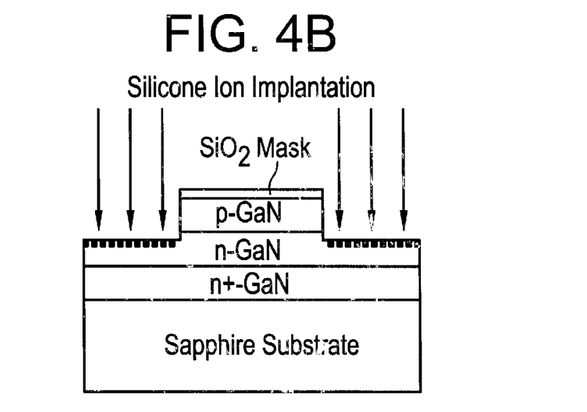
FIG. 4B is a schematic side view of the diode of FIG. 4A showing the direction of silicon ion implantation.
Figure 5A:
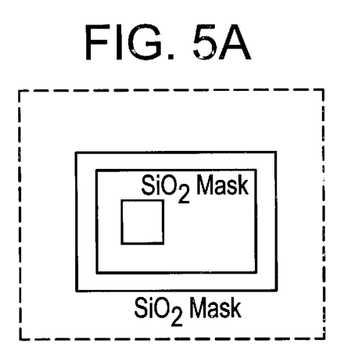
FIG. 5A is a schematic plan view of a diode of the present invention for use as an n-type emitter having a silicon mask protecting portion of the p-type mesa prior to silicon ion implantation.
Figure 5B:
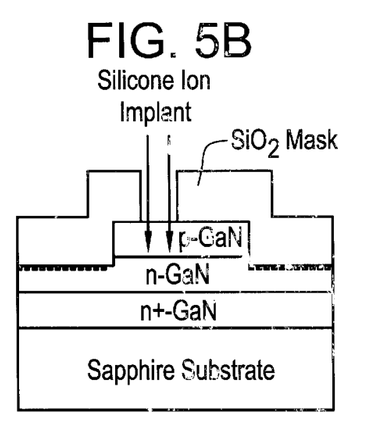
FIG. 5B is a schematic side view of the diode of FIG. 5A showing the direction of silicon ion implantation.

In this embodiment, the region of the surface of the wafer containing layers of GaN which will contain the contacts to the emitter and the base is coated with a metal film such as nickel, at least about 1 micron thick. The nickel is patterned by photolithography to define mesas by lift-off. Reactive ion etching then is used to remove the p-type base region down to the lightly doped n-type collector region except under the nickel protective layer. The nickel protective layer then is etched away. Next, the surface of the film is covered with $SiO_2$, using standard deposition techniques. Using photolithography, sets of openings, preferably two per device, are etched in the $SiO_2$, where one opening defines the emitter of each device which resides on each mesa on the wafer while the other opening defines the contact to the collector, as shown in FIGS. 4A and 4B. Silicon is then ion implanted into the sample. The $SiO_2$ layer prevents implantation of silicon into any area except an emitter island. The $SiO_2$ layer is then removed by etching, e.g., in hydrofluoric acid. Next, a thin film of AlN is deposited on the surface by MOCVD. This film preferably is about 100 nm thick. The sample is then heated to a temperature of from about 1100° C. to about 1175° C. for about 20 minutes. This serves to remove the crystal damage which resulted from the implantation step. Then the AlN film is etched away in about 5 minutes by inserting the sample in an alkaline solution for example a KOH solution, having a concentration of between about 0.1M to about 1M at about 65° C.

Figure 6A:
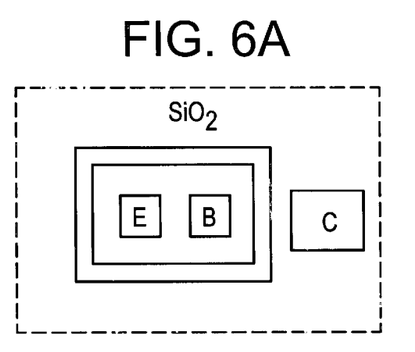
FIG. 6A is a schematic plan view of a diode of the present invention showing openings for contacts to the emitter, base and collector.
Figure 6B:
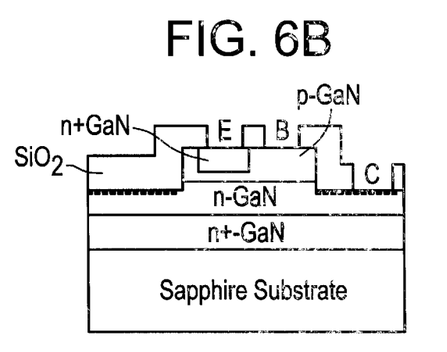
FIG. 6B is a schematic side view of the diode of FIG. 6A.
Figure 7A:
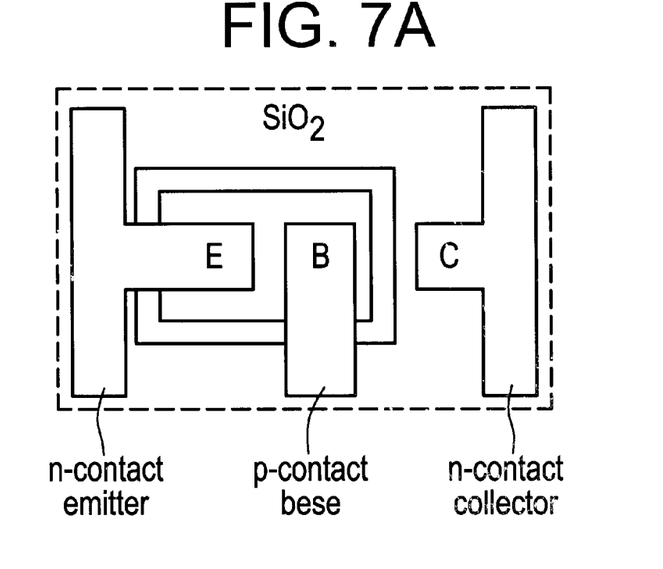
FIG. 7A is a schematic plan view of a completed BJT according to the present invention.
Figure 7B:
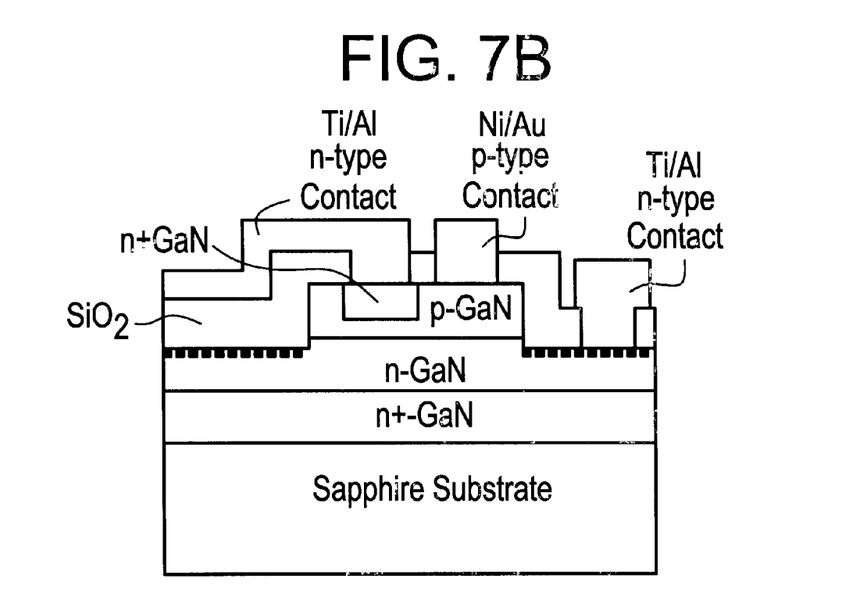
FIG. 7B is a schematic side view of the BJT of FIG. 7A.

The sample is then overcoated with another film of $SiO_2$. Using standard photolithographic procedures, holes are opened in the $SiO_2$, as shown in FIGS. 6A and 6B. Metal contacts are applied to the subcollector and the emitter island simultaneously. A shadow mask can be used to define regions of photoresist, and all excess metal is removed by lift-off. These contacts preferably are made by first evaporating titanium, followed by aluminum. The titanium preferably is from about 100 to 200 nm thick, while the aluminum should be several microns thick. Next the base contact is patterned using standard photolithography. The contact metals for the base preferably is nickel (about 200 nm) followed by gold (several microns). The transistors are now annealed rapidly for about 2 minutes at about 600° C. to activate the metal contacts and make them ohmic. The complete device is shown in FIGS. 7A and B. Finally, the wafer is diced up to give individual devices, which can be packaged according to well known packaging procedures.

As an alternative embodiment, the GaN layers may be grown on a conducting substrate, such as silicon carbide (SiC). Then mesa etching step is avoided, and the collector contact can be made to the rear of the SiC substrate. Then only the emitter island is created by ion implantation of silicon, as described above.

As an alternative embodiment, a heterojunction bipolar transistor (HBT) may be formed by implanting aluminum and nitrogen into the island into which silicon has previously been implanted. Preferably, the concentrations of aluminum and nitrogen are substantially equal. The addition of aluminum and nitrogen to gallium nitride forms an alloy with the general formula $Al_xGa_{1-x}N$, (wherein $0 \leq X \leq 1$), which have band gaps greater than that of gallium nitride. It is advantageous for the emitter to have a larger band gap than the base in order to suppress injection of carriers from the base into the emitter. For greatest signal amplification (commonly termed gain), all carriers should be injected from the emitter into the base, with none proceeding backwards. A concentration of x in $Al_xGa_{1-x}N$ exceeding 0.01 (1%) will be marginally effective in suppressing back flow, while x=0.15 (15%) will basically terminate the flow. However, as more aluminum is added, the conductivity of the emitter will be decreased. In order to maintain stoichiometry, a concentration of nitrogen ions equal to the concentration of introduced aluminum ions must be implanted. The ranges of silicon, aluminum, and nitrogen preferably is chosen to provide a substantially exact overlap of all concentrations. All growth, and subsequent capping, annealing and metallization procedures remain the same as described above.

The invention is further illustrated by the following examples, which are not intended to be limiting in any way.

EXAMPLES

Example 1: Properties of a p-type GaN Layer Converted to n-type By Silicon Ion Implantation A p-type layer of GaN was grown by MOCVD on single crystal sapphire. The Mg-doped sample had a total magnesium concentration of $4 \times 10^{19}$ atoms/cm$^{-3}$. Silicon ion implantation was performed without masking over the entire sample and had a peak concentration of $7 \times 10^{19}$ atoms/cm$^{-3}$. The sample was next capped with a 200 nm film of AlN grown by MOCVD. Then it was subjected to a 20 minute, 1100° C. anneal under flowing $N_2$ at 700 Torr. After the anneal the AlN was etched off in 0.1 M KOH solution for 10 minutes at ~62° C.

A van der Pauw geometry Hall star was then sand-blasted into the GaN samples and In-Ga liquid contacts were applied to the contact pads. In-Ga makes an excellent ohmic contact to n-type GaN over all the doping ranges ($10^{16}$ to $10^{19}$ cm$^{-3}$); however, this alloy forms a Schottky contact to p-type GaN. The Hall results on the implanted sample should be straight-forward because the p-n junction isolates the measurement from the substrate. A thermoelectric probe indicated that the implanted surface was now n-type. The sample was contacted with four In-Ga dots, and they each showed ohmic behavior. A Hall measurement was made on the sample with 0.2 µm used as the implant thickness. The results were a carrier concentration of $7.5 \times 10^{18}$ cm$^{-3}$ with a mobility of 21 cm$^2$/V-sec.

Example 2: Method for fabricating a p-n Diode By Silicon Ion Implantation into a p-type layer of GaN A p-n (equivalent to a base-emitter) diode was made in GaN as follows. A 2 micron thick film of Mg-doped GaN was grown on a sapphire substrate by MOCVD followed by annealing at 700° C. in flowing nitrogen for about 30 minutes to remove the hydrogen. The atomic Mg concentration was $4 \times 10^{19}$ atoms/cm$^{-3}$. The sample was coated with a layer of SiO$_2$. Standard photolithographic techniques were used to form openings in the SiO$_2$ layer. Each opening was a nearly square opening 100×125 microns in size. Si ions were implanted into the sample, but they only entered the p-type GaN film in the nearly square openings in the SiO$_2$ layer. The SiO$_2$ was removed, and a 100 nm film of AlN was deposited by MOCVD. The sample was then annealed at 1150° C. for 20 minutes. After cooling, the AlN film was etched away in 0.1 M KOH solution for 10 minutes at ~62° C.

Figure 8:
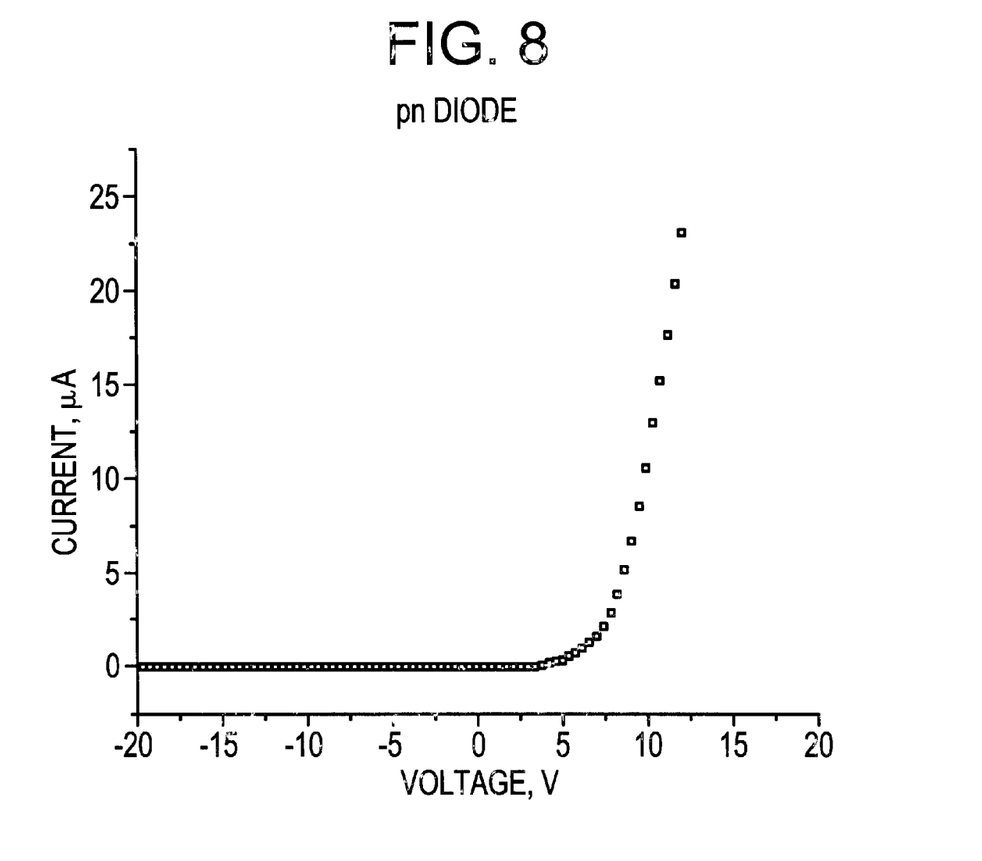
FIG. 8 is a graph illustrating the current-voltage characteristics of an ion-implanted emitted-base diode according to the present invention.

Using standard photolithographic procedures, a Ti+Al contact was deposited on each ion implanted island. Then using further photolithographic steps, a Ni+Au contact was deposited on each p-type layer contact. The devices were annealed for 2 minutes at 600° C. They diodes were then tested. With reverse biases (negative voltage to p-type layer) up to –20 volts, only negligible reverse currents were found to flow. With forward bias (positive voltage to p-type layer), the diodes turned on at about +3.5 volts, and large currents flowed when V>5 volts. A characteristic IV curve is shown in FIG. 8. This is a demonstration that the p-type layer can be converted into n-type by silicon ion implantation and that a p-n junction with diode characteristics can be formed by this method. It is also strongly indicated that it is possible to form the emitter-base junction of a GaN bipolar junction transistor using this technique.

EQUIVALENTS

Those skilled in the art will be able to ascertain many equivalents to the specific embodiments described herein. Such equivalents are intended to be encompassed by the following claims.

What is claimed is:

1. A method for forming an n-p junction in gallium nitride comprising:
   a. providing a substrate of single crystal material capable of permitting growth thereon of gallium nitride;
   b. disposing a layer of p-type gallium nitride upon said substrate;
   c. annealing said p-type layer under conditions sufficient to remove hydrogen;
   d. defining island regions in said p-type layer;
   e. ion implanting silicon into said island regions of the p-type layer;
   f. depositing an AlN capping layer onto said regions of ion implanted silicon;
   g. annealing and electrically activating said regions of ion implanted silicon under conditions sufficient to induce n-type conductivity in said regions; and
   h. depositing metal contacts on regions of p-type and n-type.

2. The method of claim 1 wherein the substrate is sapphire or gallium nitride grown on sapphire.

3. The method of claim 1 wherein the layer of p-type gallium nitride is grown by MOCVD using magnesium doping.

4. The method of claim 3 wherein the layer of p-type gallium nitride is doped with magnesium at a concentration between about $1 \times 10^{19}$ cm$^{-3}$ and about $5 \times 10^{19}$ cm$^{-3}$.

5. The method of claim 1 wherein step (c) is carried out in flowing nitrogen at about 700° C. for about 30 minutes.

6. The method of claim 1 wherein the concentration of silicon atoms implanted in step (e) is greater than about $1 \times 10^{19}$ cm$^{-3}$.

7. The method of claim 1 wherein the layer of p-type gallium nitride includes magnesium and the concentration of silicon atoms implanted in step (e) exceeds the concentration of indigenous magnesium.

8. The method of claim 1 wherein said AlN layer deposited in step (f) is grown by MOCVD.

9. The method of claim 1 wherein the thickness of said AlN layer is greater than about 50 nm but less than about 150 nm.

10. The method of claim 1 wherein the step (g) is carried out by annealing between about 1100° C. and about 1200° C. in flowing nitrogen for approximately 20 minutes.

11. The method of claim 1 wherein the metal contacts for the n-type region comprise a layer of titanium followed by a layer of aluminum.

12. The method of claim 1 wherein the metal contacts for the p-type region comprise a layer of nickel followed by a layer of gold.

* * * * *